United States Patent [19]

Lehrer

[11] Patent Number: 4,972,251
[45] Date of Patent: Nov. 20, 1990

[54] MULTILAYER GLASS PASSIVATION STRUCTURE AND METHOD FOR FORMING THE SAME

[75] Inventor: William I. Lehrer, Los Altos, Calif.

[73] Assignee: Fairchild Camera and Instrument Corp., Mountain View, Calif.

[21] Appl. No.: 765,892

[22] Filed: Aug. 14, 1985

[51] Int. Cl.$^5$ .................... H01L 29/34; H01L 23/29
[52] U.S. Cl. .................................. 357/54; 357/52; 357/73
[58] Field of Search ................. 357/54, 73, 92, 52

[56] References Cited

U.S. PATENT DOCUMENTS

| | | | |
|---|---|---|---|
| 4,185,294 | 1/1980 | Sumitomo et al. | 357/73 |
| 4,446,194 | 5/1984 | Candlelario et al. | 357/54 |
| 4,497,108 | 2/1985 | Kurosawa | 357/54 |
| 4,514,233 | 4/1985 | Kawabuchi | 357/91 |
| 4,542,400 | 9/1985 | Hiraki et al. | 357/54 |
| 4,654,269 | 3/1987 | Lehrer | 428/428 |

OTHER PUBLICATIONS

"Accuglass 203 Experimental Spin-On Glass Material", Preliminary Information Bulletin by Allied Chemical, DS-83111-B, Nov. 1983.

Sakka et al., "Formation of Sheets and Coating Films from Alkoxide Solutions", *Journal of Non-Crystalline Solids*, 63 (1984), 223-235.

Primary Examiner—J. Carroll
Attorney, Agent, or Firm—Burns, Doane, Swecker & Mathis

[57] ABSTRACT

A thick glass passivation layer comprises an alternating sequence of structurally dissimilar but chemically compatible layers of material over the surface of a substrate, so as to provide sufficient elasticity to compensate for thermal expansion differences that would otherwise crack causing in thick monolithic films. A first layer comprises glass that has been deposited over the surface of the structure using chemical vapor deposition. A second layer of the passivating glass material is then provided on the substrate using a spinning technique. The chemical vapor deposition and spun layers continue to be applied in an alternating fashion until a film having the desired thickness is formed. Each chemical vapor deposition layer provides an elastic cushion for the subsequently spun layers. The spun layers allows a planar topography to be maintained without the need for high temperatures.

11 Claims, 1 Drawing Sheet

MULTILAYER GLASS PASSIVATION STRUCTURE AND METHOD FOR FORMING THE SAME

BACKGROUND OF THE INVENTION

The present invention is directed to the coating of a semiconductor structure to passivate its surface, and more particularly is concerned with the formation of a thick glass coating over a semiconductor structure containing a patterned metal layer.

The passivation of the surface of a semiconductor substrate is carried out by coating it with a layer of oxide or other inert material. Where the entire surface of the semiconductor material is exposed, the formation of the oxide layer can be carried out through conventional thermal growth processes. However, when it is desired to provide the oxide layer over a patterned conducting layer or other type of semiconductor structure having an uneven surface, thermal oxidation processes are not suitable. In this case, the formation of the passivating layer must be accomplished through the use of deposition or other coating processes.

Coupled with this constraint is the fact that the resulting oxide layer must have a relatively planar surface in order that subsequent photolithographic projection onto this surface will have proper definition. In other words, if the surface of the passivation layer is uneven, a light pattern that is projected onto the surface through a photomask could be skewed in the locations where the height of the passivation surface varies, and hence result in a faulty circuit.

In the past various approaches have been employed to provide a passivation layer having a substantially planar surface. In one such approach, a relatively thick layer of glass, e.g., silicon dioxide, germanium dioxide or a mixture of the two, is deposited over the entire surface of the substrate. The glass is then heated to a temperature near its melting temperature to cause it to reflow so that its surface becomes smooth. This technique has been used with success where the patterned conducting layer is comprised of polycrystalline silicon or similar such materials having a relatively high melting temperature. However, when the patterned conducting layer is comprised of a material such as aluminum or aluminum alloys, this technique cannot be employed, since the melting temperature of the glass is typically greater than that of the conducting material. If the glass were to be heated to cause it to reflow, the integrity of the conducting layer would be diminished, with a faulty circuit being the likely result.

Accordingly, when a patterned conducting layer is comprised of a metal or other such material having a relatively low melting temperature, the passivating glass layer is coated on the structure by means of a spinning process so as to provide a relatively planar surface without the need for high temperatures. Basically, the spinning process involves placing a solution of the passivating material, e.g. an oxide precursor, in the center of the semiconductor wafer and then spinning the wafer at a speed and for a length of time sufficient to cause the solution to spread out over the entire surface of the structure. The resulting film that is formed over the structure has a substantially planar surface.

However, the spinning technique is also not without its attendant limitations. Foremost among these is the fact that the glass film should not have a thickness greater than about 1,000–3,000 angstroms. If the film is any thicker than this, the differential coefficient of expansion between the film and the underlying silicon or metal layer will cause the film to crack when it undergoes temperature changes.

This limitation prevents the practical use of the spinning technique in a commercial environment. Typically, a patterned metal layer might have a height of about 0.7–1.2 microns, so that the passivating glass layer should have a thickness of at least 0.8–1.3 microns if the metal layer is to be properly covered. Furthermore, when the topography of the semiconductor structure is particularly intricate, the passivating layer might have to have a thickness on the order of 2.0 microns or more.

Accordingly, in the past the use of the spinning technique to coat a glass passivating layer has been limited to semiconductor structures having relatively flat surfaces, since a thick layer of glass is not necessary to passivate these structures.

OBJECTS AND BRIEF STATEMENT OF THE INVENTION

It is therefore a general object of the present invention to provide a novel planar glass layer, and method for forming such a layer, which enables semiconductor structures having patterned metal layers to be passivated without the use of high temperatures.

It is a more specific object of the invention to provide a novel method for passivating a surface of a semiconductor structure using spin-coating technology.

In accordance with the present invention, these and other objects and their attendant advantages are achieved by providing an alternating sequence of structurally dissimilar but substantially chemically identical layers of the passivating material over the surface of the substrate, so as to provide sufficient elasticity to compensate for thermal expansion differences that would otherwise cause cracking in thick monolithic films. A first layer comprises silicon dioxide or germanium dioxide, or a mixture of the two, that has been deposited over the surface of the structure using chemical vapor deposition. A second layer of passivating glass material is then provided on the substrate using a spinning technique. The chemical vapor deposition and spun layers continue to be applied in an alternating fashion until a film having the desired thickness is formed. Each chemical vapor deposition layer provides an elastic cushion for the subsequently spun layers. The spun layers allow a planar topography to be maintained without the need for high temperatures.

Further features and advantages of the invention are described in detail hereinafter with reference to a particular embodiment illustrated in the accompanying drawings.

DETAILED DESCRIPTION OF A PREFERRED EMBODIMENT

In the following description of a preferred embodiment of the invention, particular reference is made to the formation of a thick glass layer over a semiconductor substrate having a patterned metal layer, in order to facilitate an understanding of the invention and its applications. However, it will be appreciated by those having familiarity with this technology that the practical uses of the invention are not limited to the specific disclosed embodiment. Rather, the invention has utility in a number of different environments in which it is desired to form a relatively thick planar film using a spin-coating technology.

Figure 1:
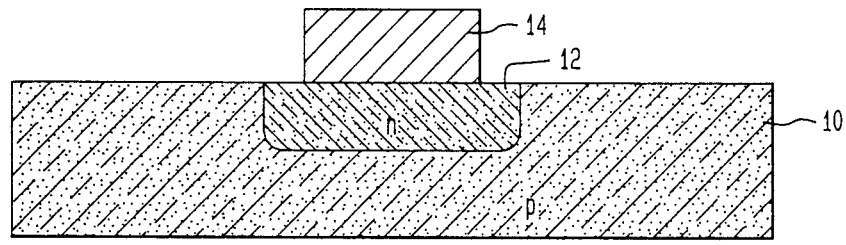
FIG. 1 is a cross-sectional side view of a portion of a semiconductor substrate having a patterned metal layer thereon.

Referring to FIG. 1, a portion of a semiconductor structure of the type to which the present invention might typically be applied is schematically illustrated. The structure comprises a silicon substrate 10 that has been appropriately doped with an impurity to give it a desired conductivity. A region 12 within the substrate is doped with an impurity of opposite conductivity to form one element, e.g., the emitter or collector, of a transistor. A layer of metal, such as aluminum, is deposited over the silicon substrate and then appropriately etched to form a pattern which includes a contact 14 to the transistor element that provides for electrical connection to other circuit elements. This metal layer typically might have a thickness in the range of 3,000–12,000 angstroms.

It is desirable to passivate the exposed surface of the substrate 10 to protect it against contaminants that might chemically react with it and adversely affect the electrical characteristics of the junction between the substrate 10 and the transistor element 12. Such passivation is achieved by forming a film of a chemically inert material over the entire surface of the structure. This material typically comprises an oxide, such as silicon dioxide. In accordance with the present invention, the oxide film is formed by providing a layer of gel over the surface of structure and then heating the gel to form the desired oxide, or glass.

Figure 2:
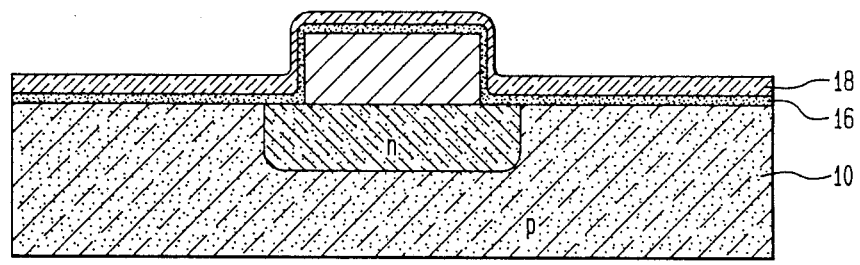
FIG. 2 is a cross-sectional side view of the substrate of FIG. 1 after a chemical vapor deposition layer and a spun layer of the passivating glass material have been provided on it.

Further in accordance with the invention, the thick layer of glass is provided by building up structurally dissimilar but chemically compatible layers of the glass material. Referring now to FIG. 2, a first layer of the glass is formed on the structure by means of chemical vapor deposition (CVD), for example an atmospheric CVD technique. This glass layer can be comprised of a silicon dioxide/germanium dioxide composition, pure germanium dioxide, pure silicon dioxide or any mixture thereof. This layer can have a thickness in the range of 1,500–5,000 angstroms, and is preferably about 3,000 angstroms.

A second layer 18 of the passivation material is then formed over the CVD layer 16 using a conventional spinning process. Any of the conventional metal alkoxide solutions that are used as a spin-on glass material, such as tetraethyl orthosilicate (TEOS) or mixed alkoxide solutions, can be used to form the second layer 18. After spinning, the structure is heated, in the presence of water if necessary, to convert the spun film into a solid layer of oxide material.

While the spun layer preferably has substantially the same chemical makeup as the CVD layer 16, it need not necessarily be identical. However, the materials comprising the two layers must be sufficiently compatible as to result in a passivating layer of the desired composition. For example, the CVD layer could be comprised of a composition of silicon dioxide and germanium dioxide, whereas the spun layer 18 might consist primarily of silicon dioxide, with little or no germanium present. The primary concern here is the effect that any chemical variance between the two layers may have upon subsequent etching operations. As long as the different layers react to the etch plasma in a similar fashion, chemical differences between them should be inconsequential, as far as cracking is concerned.

The thickness of the spun layer 18 is determined by the viscosity of the solution used to form the layer, the alkoxide content, and the spinning speed and time. Typically, this layer might have a thickness of about 1,500–4,000 angstroms, and is preferably about 2,000 angstroms. Thus, the two layers 16 and 18 together might have a total thickness of about 5,000 angstroms.

Figure 3:
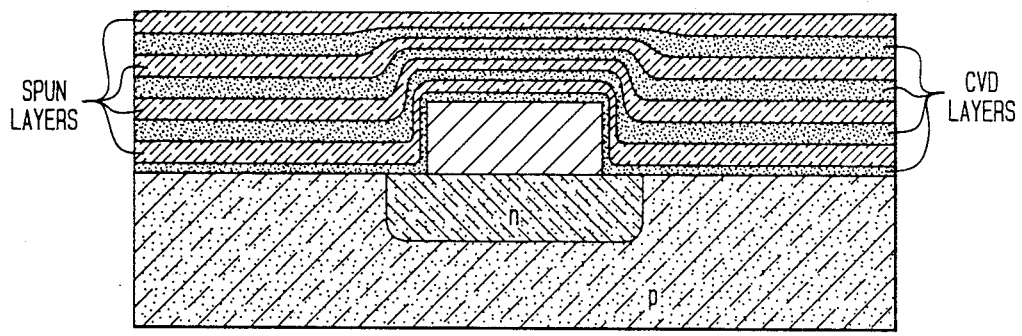
FIG. 3 is a cross-sectional side view of the semiconductor structure after a number of alternating layers of the passivating material have been formed so as to provide a film of the desired thickness.

In order to provide a film having the desired total thickness, e.g., 10,000–20,000 angstroms, similar CVD and spun layers are applied to the structure in an alternating fashion to build up the total thickness of the film, as illustrated in FIG. 3. Each of the two types of layers contributes different characteristics which, when combined, enable a thick glass layer to be obtained without the undesirable risk of cracking due to thermal expansion. The spun layer enables a substantially planar topography to be ultimately obtained without the need for high temperature reflow techniques. The CVD layer has a greater elasticity than the spun layer and thereby offers a measure of compensation for thermal expansion differences between the spun glass layers and the substrate or the metal. In essence, this layer provides a thermal expansion gradient between the spun glass and the coated structure. Therefore, the integrity of the metal layer 14 can be maintained while at the same time providing a spun glass passivation technique.

Features of the invention described above will now be illustrated with reference to a particular example.

EXAMPLE

The semiconductor structure to be passivated included a layer of patterned aluminum over oxide that had been thermally grown on a silicon substrate. The patterned aluminum had a height of about 7,000 angstroms.

A layer of PVX-I, a composition consisting of 96% $SiO_2$ and 4% phosphorous (for doping purposes), was deposited over the thermal oxide and the patterned aluminum to a thickness of 3,000 angstroms and the structure was annealed at 450° C. for about 15 minutes.

A spin glass comprised of Accuglass 203 (with about 10% alkoxide content), sold by Allied Chemicals, was applied over the CVD layer at a spinning rate of 5,000 rpm. The wafer was heat treated at 450° C. for 15–30 minutes to drive off the solvent, resulting in a silicon dioxide layer of about 2,000 angstroms.

The deposition of the CVD layer and the application of the spin glass coating was applied in alternating steps until a silicon dioxide film having a total thickness of 8–9,000 angstroms was formed. The resulting structure was able to withstand temperature changes from 25° C. to 500° C. without cracking of the passivating glass layer.

It will be appreciated by those of ordinary skill in the art that the present invention can be embodied in other specific forms without departing from the spirit or essential characteristics thereof. For example, although chemical vapor deposition has been described as the preferred method for providing the cushion layer between successive spun layers, other suitable processes for achieving the same result might be used. Thus, instead of or in addition to being characterized by a greater elasticity, the cushion layer might have a coefficient of thermal expansion which lies intermediate those of the spun glass layers and the semiconductor structure to provide the desired gradient.

The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A semiconductor structure having a relatively thick layer of glass thereon to passivate the surface of the structure, wherein said thick layer of glass is comprised of a sequence of alternating first and second thin layers of glass with each of said thin layers of glass having substantially the same chemical identity as adjacent thin layers of glass and differing from said adjacent layers in that said first thin layers of glass function to provide a substantially planar topography to said relatively thick layer of glass and said second layers of glass have greater elasticity than said first thin layers.

2. The semiconductor structure of claim 2 wherein the structure includes a semiconductor substrate having a patterned metal layer with a thickness of about 3,000–12,000 angstroms on the surface of said substrate.

3. The semiconductor structure of claim 1 wherein said alternating second and first thin layers of glass are respectively formed by chemical vapor deposition and spin coating processes.

4. A semiconductor structure, comprising:
   a semiconductor substrate;
   a patterned metal layer on the surface of said substrate;
   a first series of glass layers disposed over said substrate and said metal layer and providing a substantially planar surface; and
   a second series of glass layers respectively interposed between the layers of said first series, the glass layers of said second series having greater elasticity than the layers of said first series to compensate for differences in thermal expansion of the semiconductor substrate, the metal layer and the glass layers of the first series.

5. The structure of claim 4 wherein one of the glass layers of said second series is disposed between the semiconductor substrate and the first series of glass layers.

6. The structure of claim 4 wherein the glass layers of said first and second series have essentially the same chemical identity.

7. The semiconductor structure of claim 4 wherein the glass layers in said first series are spun layers and the glass layers in said second series are chemical vapor deposition layers.

8. A semiconductor structure having a patterned metal layer and a passivated surface over said metal layer which is produced by the process of:
   forming a first layer of an oxide material on the surface of the semiconductor structure over said patterned metal layer;
   spin-coating a second layer of oxide material on said first layer;
   depositing a third layer of oxide material on said second layer by means other than a spin-coating process;
   spin-coating a fourth layer of oxide material on said second layer; and
   alternately repeating said depositing and spin-coating steps until a substantially planar surface is formed over said metal layer without affecting the pattern of said metal layer.

9. The semiconductor structure of claim 8 wherein at least one of said first and third layers is formed by means of a chemical vapor deposition process.

10. A semiconductor structure having a patterned metal layer and a relatively thick layer of glass on its surface and produced by the process of:
   (a) depositing a relatively thin layer of glass on the surface of the structure and over said metal layer by means of chemical vapor deposition;
   (b) coating said thin layer with a second layer of glass using a process other than chemical vapor deposition that ultimately provides said thick layer of glass with a substantially planar surface without affecting the pattern of said metal layer; and
   (c) sequentially repeating steps (a) and (b) as required to build alternating layers of glass to a planar topology having a desired cumulative thickness.

11. The semiconductor structure of claim 10 wherein the second layer is coated on the first layer by means of a spinning process.

* * * * *